US008634444B2

(12) United States Patent
Bianchi et al.

(10) Patent No.: US 8,634,444 B2
(45) Date of Patent: *Jan. 21, 2014

(54) SELF-CONTAINED RANDOM SCATTERING LASER DEVICES

(75) Inventors: Maurice P. Bianchi, Palos Verdes Estates, CA (US); Timothy R. Kilgore, Orange, CA (US); David A. Deamer, Seal Beach, CA (US)

(73) Assignee: The Boeing Company, Chicago, IL (US)

( * ) Notice: Subject to any disclaimer, the term of this patent is extended or adjusted under 35 U.S.C. 154(b) by 195 days.

This patent is subject to a terminal disclaimer.

(21) Appl. No.: 12/577,746

(22) Filed: Oct. 13, 2009

(65) Prior Publication Data

US 2010/0098125 A1    Apr. 22, 2010

Related U.S. Application Data

(60) Provisional application No. 61/105,948, filed on Oct. 16, 2008.

(51) Int. Cl.
*H01S 3/0957*    (2006.01)

(52) U.S. Cl.
USPC ............................. 372/73; 372/43.01; 372/92

(58) Field of Classification Search
USPC .......................... 372/69, 70, 74, 73, 43.01, 41
See application file for complete search history.

(56) References Cited

U.S. PATENT DOCUMENTS

| 3,391,281 | A | | 7/1968 | Erkens |
| 3,559,095 | A | * | 1/1971 | Nielson ............................ 372/73 |
| 3,667,068 | A | * | 5/1972 | Morrison et al. ............... 372/73 |
| 5,015,863 | A | | 5/1991 | Takeshima et al. |
| 5,229,320 | A | | 7/1993 | Ugajin |
| 5,260,957 | A | | 11/1993 | Hakimi et al. |
| 5,293,050 | A | | 3/1994 | Chapple-Sokol et al. |
| 5,482,890 | A | | 1/1996 | Liu et al. |
| 5,512,762 | A | | 4/1996 | Suzuki et al. |
| 5,559,822 | A | | 9/1996 | Pankove et al. |
| 5,684,309 | A | | 11/1997 | McIntosh et al. |
| 5,888,885 | A | | 3/1999 | Xie |
| 5,906,670 | A | | 5/1999 | Dobson et al. |
| 6,768,754 | B1 | | 7/2004 | Fafard |
| 7,103,079 | B2 | | 9/2006 | McInerney et al. |
| 7,183,718 | B2 | | 2/2007 | Yoshida |

(Continued)

OTHER PUBLICATIONS

Amar et al., "Random Laser Action in ZnO Doped Polymer," Jun. 23, 2006, J. Appl. Phys. 99, 123509.*

(Continued)

*Primary Examiner* — Jessica Stultz
*Assistant Examiner* — Joshua King
(74) *Attorney, Agent, or Firm* — Christopher J. Knors; Moore & Van Allen PLLC

(57) ABSTRACT

The present disclosure relates to a self-contained, random scattering laser generating device comprising a housing comprises an opening and an inner chamber, at least one quantum dot positioned inside the inner chamber, a high-energy emitting source positioned within the inner chamber and in radioactive communication with the at least one quantum dot, and a first lasing medium. The present disclosure also relates to a method comprising providing at least one quantum dot, contacting the at least one quantum dot with a high-energy emitting source whereby randomly scattered light is produced, partially coherently amplifying the randomly scattered light emitted from the at least one quantum dot, and generating a random scattering laser.

19 Claims, 9 Drawing Sheets

(56) References Cited

U.S. PATENT DOCUMENTS

| | | | |
|---|---|---|---|
| 7,192,999 B2 | 3/2007 | Mercado et al. | |
| 7,264,527 B2 | 9/2007 | Bawendi et al. | |
| 2001/0043380 A1 | 11/2001 | Ohtsubo | |
| 2002/0001115 A1 | 1/2002 | Ishida et al. | |
| 2005/0152429 A1* | 7/2005 | Scherer | 372/92 |
| 2006/0261325 A1* | 11/2006 | Zanrosso et al. | 257/14 |
| 2008/0175292 A1 | 7/2008 | Sheik-Bahae | |
| 2010/0028005 A1 | 2/2010 | Beckett | |
| 2010/0084571 A1* | 4/2010 | Bianchi et al. | 250/459.1 |
| 2010/0098125 A1 | 4/2010 | Bianchi et al. | |

OTHER PUBLICATIONS

Biersack et al.; Ion Beam Induced Changes of the Refractive Index of PMMA; Nuclear Instruments and Methods in Physics Research B46; 1990; pp. 309-312; Elsevier Science Publishers B.V. (North-Holland).

Calvert; Vegetable and mineral; Nature; Oct. 1991; pp. 501-502; vol. 353; Nature Publishing Group.

Dabbousi et al.; (CdSe)ZnS Core-Shell Quantum Dots: Synthesis and Characterization of a Size Series of Highly Luminescent Nanocrystallites; The Journal of Physical Chemistry B; 1997; V101; pp. 9463-9475; American Chemical Society.

Finlayson et al.; Infrared Emitting PbSe Quantum Dots for Telecommunications-Window Applications; OSA/ ASSP 2005.

Franklin et al.; Refractive Index Matching: A General Method for Enhancing the Optical Clarity of a Hydrogel Matrix; Chemistry of Materials; 2002; pp. 4487-4489; 14; American Chemical Society.

Hecht, Jeff; "The Laser Book," $2^{nd}$ Ed., Tab Books, Blue Ridge Summit, PA, (1992); ISBN 0-07-027737-0; pp. 389-417 (Chapter 22).

Hines et al.; Synthesis and Characterization of Strongly Luminescing ZnS-Capped CdSe Nanocrystals; J. Phys. Chem.; 1996; pp. 468-471; 100; American Chemical Society.

Jiang et al., "Transparent Electro-Optic Ceramics and Devices," Optoelectronic Devices and Integration. Edited by Ming, Hai; Zhang, Xuping; Chen, Maggie Yihong. Proceedings of the SPIE, vol. 5644, pp. 380-394 (2005).

Jiang et al.; Optimizing the Synthesis of Red-to Near-IR-Emitting CdS-Capped CdTexSel-x Alloyed Quantum Dots for Biomedical Imaging; Chem. Mater.; 2006; pp. 4845-4854; 18; American Chemical Society.

Jin et al.; Gd3+-functionalized near-infrared quantum dots for in vivo dual modal (fluorescence/magnetic resonance) imaging; Chem. Commun.; 2008; pp. 5764-5766; The Royal Society of Chemistry 2008.

Klonkowski et al.; Emission enhancement of Eu(III) and/or Tb(III) ions entrapped in silica xerogels with ZnO nanoparticles by energy transfer; Journal of Non-Crystalline Solids; 352; 2006; pp. 4183-4189; Elsevier B.V.

Krier et al.; Mid-infrared electroluminescence from InAsSb quantum dot light emitting diodes grown by liquid phase epitaxy; Physica E 15; 2002; pp. 159-163; Elsevier Science B.V.

Kuntz et al.; 10Gbit/s data modulation suing 1.3 pm InGaAs quantum dot lasers; Electronic Letters; Mar. 3, 2005; vol. 41, No. 5; IEE.

Leon; Intermixing induced tunability in infrared emitting InGaAs/ GaAs quantum dots; SPIE; Jul. 1999; vol. 3794; Part of the SPIE Conference Materials for High-Speed Detectors; Denver, CO, US.

Madler et al.; Rapid synthesis of stable ZnO quantum dots; Journal of Applied Science; vol. 92, No. 11; Dec. 1, 2002; pp. 6537-6540; American Institute of Physics.

Mao et al.; Synthesis of high-quality near-infrared-emitting CdTeS alloyed quantum dots via the hydrothermal method; Nanotechnology; 2007; 485611 (7pp); 18; 10P Publishing Ltd.; UK.

Novak; Hybrid Nanocomposite Materials-Between Inorganic Glasses and Organic Polymers; Advanced Materials; 1993; pp. 422-433; 5, No. 6; VHC Verlagsgesellschaft mbH, D-69469 1993.

Otsubo et al.; Temperature-Insensitive Eye-Opening under 10-Gb/s Modulation of 1.3-pm P-Doped Quantum-Dot Lasers without Current Adjustments; Japanese Journal of Applied Physics; 2004; pp. L1124-L1126; vol. 43, No. 8B; The Japan Society of Applied Physics.

Peng et al.; Epitaxial Growth of Highly Luminescent CdSe/CdS Core/Shell Nanocrystals with Photostability and Electronic Accessibility; J. Am. Chem.Soc.; 1997; V119; pp. 7019-7029; American Chemical Society.

Peng et al.; Formation of High-Quality CdTe, CdSe, and CdS Nanocrystals Using CdO as Precursor; J. Am. Chem. Soc.; 2001; vol. 123, No. 1; pp. 183-184; American Chemical Society.

Qu et al.; Alternative Routes toward High Quality CdSe Nanocrystals; Nano Letters; 2001; pp. 333-337; vol. 1, No. 6; American Chemical Society.

Schaller et al., Seven Excitons at a Cost of One: Redefining the Limits for Conversion Efficiency of Photons into Charge Carriers Nano Lett. Mar. 2006;6(3):424-9.

Shabaev et al., Multiexciton Generation by a Single Photon in Nanocrystals, Nano Lett. (2006) 6(12).

Shan et al.; The structure and character of CdSe nanocrystals capped ZnO layer for phase transfer from hexane to ethanol solution; Surface Science; 582; 2005; pp. 61-68; Elsevier B.V.

Song et al., Red light emitting solid state hybrid quantum dot—near-UV GaN LED devices Nanotechnology 2007 18 255202 (4pp).

Ulrich; Prospects for Sol-Gel Processes; Journal of Non-Crystalline Solids; 1990; pp. 465-479; 121; Elsevier Science Publishers B.V. (North-Holland).

Wasserman et al.; Mid-Infrared Electroluminescence from InAs Self-Assembled Quantum Dots; Proc. of SPIE; 2006; vol. 6386, 6386E-1.

Wu et al; Surface modification of ZnO nanocrystals; Applied Surface Science; 253; 2007; pp. 5473-5479; Elsevier B.V.

Zhang et al.; Wet-Chemical Synthesis of ZnTe Quantum Dots; Mater. Res. Soc. Symp. Proc.; 2006; vol. 942; Materials Research Society.

Bianchi, Maurice, et al., Non-Final Rejection for U.S. Appl. No. 12/573,417 dated Apr. 30, 2012.

* cited by examiner

US 8,634,444 B2

SELF-CONTAINED RANDOM SCATTERING LASER DEVICES

CROSS-REFERENCE TO RELATED APPLICATIONS

This application claims benefit of priority under 35 U.S.C. §119(e) to the filing date of U.S. Provisional Application 61/105,948, filed on Oct. 16, 2008, which is incorporated herein by reference in its entirety.

TECHNICAL FIELD

The present disclosure relates generally to random scattering laser generating devices. More particularly, the present disclosure relates to novel self-contained random, scattering laser generating devices that utilize a high-energy emitting source and quantum dots for the generation of a scattering medium laser.

BACKGROUND

A laser is a device that emits light (electromagnetic radiation) through a process called stimulated emission. The term "laser" is an acronym for Light Amplification by Stimulated Emission of Radiation" and refers to light that is usually spatially coherent (e.g., the light is either emitted in a narrow, low-divergence beam or can be converted into one with the help of optical components such as lenses). Typically, lasers are thought of as emitting light with a narrow wavelength spectrum (e.g., monochromatic light). However, this is not true of all lasers. Some emit light with a broad spectrum, while others emit light at multiple distinct wavelengths simultaneously.

Lasers have many uses in today's world. For example, in manufacturing, lasers are used for cutting, bending and welding metal and other materials, and for "marking" (e.g., producing visible patterns such as letters by changing the properties of a material or by inscribing its surface). In science and medicine, lasers are used for many applications, such as spectroscopy, surgery, diagnostics, and therapeutic applications. In the military, lasers are used for range-finding, target designation and illumination, as well as directed-energy weapons. Lasers also have many uses in space applications.

The typical design of a laser comprises three basic components: an energy source (often referred to as a pump or pump source), a gain or lasing/laser medium, and a mirror or system of mirrors that form an optical resonator. In its simplest form, a cavity or chamber consists of two mirrors arranged such that light bounces back and forth, each time passing through the gain medium. Typically one of the two mirrors, the output coupler, is partially transparent. The output laser beam is emitted through this mirror.

The process of supplying the energy required for the amplification, called pumping, is typically supplied as an electrical current or as a light at a different wavelength. Such light may be provided by a flash lamp or perhaps another laser. These pump sources, however, require an external energy source, such as a connection to a power line. There are many instances, however, where it is impractical or impossible to provide electrical power via a power line. In such instances, such as when the device is in space or a remote location, other sources of power must be used, such as batteries and generators. These, however, are not without their drawbacks since batteries and generators often have short operating lives before needing recharging, replacement, or refueling. These are critical problems for those devices used in space applications (e.g., satellites) or those located in hard to reach places.

As such, it would be advantageous to provide a self-contained and self-contained, random scattering laser generating device that provides long-lasting, uninterrupted power for the generation of a medium scattering laser.

SUMMARY

The present disclosure relates to a self-contained, random scattering laser device that comprises a high-energy emitting source, at least one quantum dot, at least one reflector and an aperture. The device is able to operate continuously for long periods of time (e.g., for at least as long as the half-life of the radioisotope used) without the need for an outside source of power or the need for recharging or refueling, thereby making the devices of the present disclosure aptly suited for remote or space applications.

In a first embodiment, a self-contained, random scattering laser generating device is provided. The device comprises a housing comprising an opening and an inner chamber. A transparent or translucent matrix of sol-gel or polyacrylate is positioned inside the inner chamber. At least one quantum dot comprising at least one of CdS, CdSe, CdTe, ZnS, ZnS, ZnSe, or ZnTe is configured in the matrix. A high-energy emitting source is positioned within the inner chamber and in communication with the at least one quantum dot, the high-energy emitting source comprising thallium-204. At least one lasing medium and at least one reflector is positioned within the inner chamber and in optical communication with the at least one lasing medium. An aperture is positioned proximal to the opening, and a lens is positioned in optical communication with the aperture.

In a second embodiment, a self-contained, random scattering laser generating device is provided. The device comprises a housing comprising an opening and an inner chamber. At least one quantum dot is positioned inside the inner chamber. A high-energy emitting source in radioactive communication with the at least one quantum dot and a first lasing medium are positioned inside the inner chamber.

In a first aspect of the second embodiment, the at least one quantum dot emits light with a wavelength in the range of about 1 nm to about $10^{11}$ nm.

In a second aspect of the second embodiment, the device further comprises a high emittance coating that surrounds the outside of the housing. In certain embodiments, the high emittance coating is selected from the group consisting of anodized aluminum, aluminum oxide, zinc oxide, magnesium oxide, composites thereof and combinations thereof. In preferred embodiments, the high emittance coating is anodized aluminum.

In a third aspect of the second embodiment, the laser device further comprises an insulation layer between the housing and the high-energy emitting source. In certain embodiments, the insulation layer is boron nitride or aluminum oxide. In preferred embodiments, the insulation layer is boron nitride.

In a forth aspect of the second embodiment, the laser device further comprises an additional heat sink material that is in thermal communication with the high-energy emitting source.

In a fifth aspect of the second embodiment, the waves/particles emitted by the high-energy emitting source are UV waves, x-rays, gamma rays, alpha particles, beta particles, or combinations thereof. In certain embodiments, the radioisotopes are selected from the group consisting of thallium-204, plutonium-238, curium-244, strontium-90, polonium-210, promethium-147, caesium-137, cerium-144, ruthenium-106, cobal-60, curium-242, and americium-241. In preferred embodiments, the high-energy emitting source is thallium-204.

In a sixth aspect of the second embodiment, the quantum dot comprises an inert material. In certain embodiments, the size of the quantum dot is in a range of 1 nm to 50 nm, preferably 1 nm to 40 nm, more preferably 1 nm to 20 nm.

In a seventh aspect of the second embodiment, the quantum dot comprises a core selected from the group consisting of CdS, CdSe, CdTe, ZnS, ZnS, ZnSe, ZnTe, GaAs, GaP, GaAs, GaSb, HgS, HgSe, HgTe, InAs, InP, InSb, AlAs, AlP, AlSb, PbS, PbSe, PbTe alloys thereof, and combinations thereof.

In an eighth aspect of the second embodiment, the quantum dot further comprises a coating. The coating is selected from ZnO, ZnS, ZnSe, ZnTe, CdO, CdS, CdSe, CdTe, MgS, MgSe, GaAs, GaN, GaP, GaSb, HgO, HgS, HgSe, HgTe, InAs, InN, InP, InSb, AlAs, AlN, AlP, AlSb, alloys thereof, or combinations thereof.

In a ninth aspect of the second embodiment, the at least one quantum dot is dispersed in a matrix. In other embodiments, the matrix is translucent or transparent. In certain embodiments, the matrix is made of material selected from polyacrylate, polystyrene, polyimide, polyacrylamide, polyethylene, polyvinyl, poly-diacetylene, polyphenylene-vinylene, polypeptide, polysaccharide, polysulfone, polypyrrole, polyimidazole, polythiophene, polyether, epoxies, silica glass, silica gel, siloxane, polyphosphate, hydrogel, agarose, cellulose, and the like. In preferred embodiments, the matrix is Sol Gel or polyacrylate.

In a tenth aspect of the second embodiment, the device further comprises at least one reflector. The reflector comprises a highly polished metal, such as aluminum or copper, or a mirror.

In an eleventh aspect of the second embodiment, the device comprises a plurality of lasing medium that is able to emit coherent radiation. In one embodiment, the at least one lasing medium is selected from the group consisting of crystals, glasses, and gases.

In a twelfth aspect of the second embodiment, where the at least one lasing medium is a crystal, the crystal may be doped with a rare-earth ion or a transition metal ion. Preferred examples of crystals for use in the device of the present disclosure include yttrium aluminum garnet (YAG), yttrium orthovanadate ($YVO_4$) and sapphire ($Al_2O_3$).

In a thirtieth aspect of the second embodiment, the at least one lasing medium is a glass. In certain embodiments, the glass is silicate or phosphate. In other embodiments, the glass is further doped with laser-active ions.

In a fortieth aspect of the second embodiment, the at least one lasing medium is a gas. In certain embodiments, the gas is selected from the group consisting of helium and neon (HeNe), nitrogen, argon, carbon monoxide (CO), carbon dioxide ($CO_2$) and metal vapors.

In a fiftieth aspect of the second embodiment, the device may further comprise a focusing element positioned in optical communication with the aperture. In certain embodiments, the focusing element is a partially transparent mirror, a curved mirror, or a lens. In a preferred embodiment, the focusing element is a mirror.

Another aspect as herein disclosed and described provides a method of generating a random scattering laser. The method comprising providing at least one quantum dot, contacting the at least one quantum dot with a high-energy emitting source whereby randomly scattered light is produced, partially coherently amplifying the randomly scattered light emitted from the at least one quantum dot, where a random scattering laser is generated.

The aspects of the above embodiments may be combined. Various other aspects, features and embodiments will be more fully apparent from the ensuing discussion and appended claims.

DETAILED DESCRIPTION

Unless otherwise defined, all technical and scientific terms used herein have the same meaning as commonly understood by one of ordinary skill in the art to which this disclosure belongs. Although methods and materials similar or equivalent to those described herein can be used in the practice or testing of the present disclosure, preferred methods and materials are described herein.

The articles "a" and "an" are used herein to refer to one or to more than one (i.e. at least one) of the grammatical object of the article. By way of example, "an element" means at least one element and can include more than one element.

Figure 1:
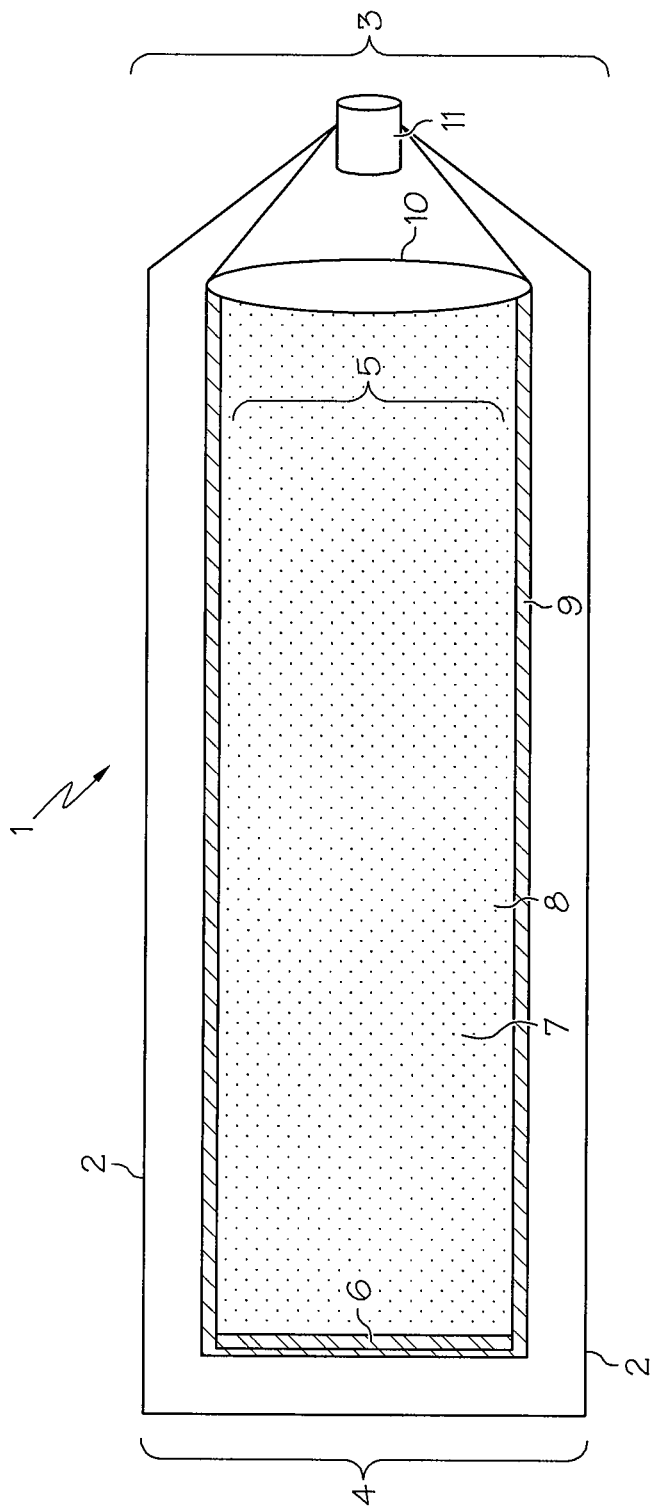
FIG. 1 represents one embodiment of a self-contained, random scattering laser device as herein disclosed and described.

In general terms, and as illustrated in FIG. 1, the present disclosure relates to a self-contained, random scattering laser generating device 1 that comprises a housing 2, with a first end 3, a second end 4, and an inner chamber 5, a high-energy emitting source 6 positioned in the inner chamber 5, at least one quantum dot 7 dispersed in a matrix 8 positioned inside the inner chamber 5 and in radioactive communication with the high-energy emitting source 6, at least one reflector 9 positioned within the inner chamber 5 and in optical communication with the at least one quantum dot 7, and an aperture 10 positioned at proximal to the opening at end 3 of the housing 2. The laser generating device may further comprise a focusing element 11.

As used herein, the terms "light" and "photon" are used interchangeably, and are defined as a discreet bundle of electromagnetic energy. These terms are intended to include gamma rays, x-rays, ultraviolet rays, visible light, infrared light, microwaves and radiowaves.

The term "optical communication" as used herein is defined as the ability of an object to come into contact with light reflected by, or emitted from, a different object.

As used herein, the term "radioactive communication" refers to the ability of the particles emitted from the radioisotope to reach and excite the quantum dot.

Figure 2:
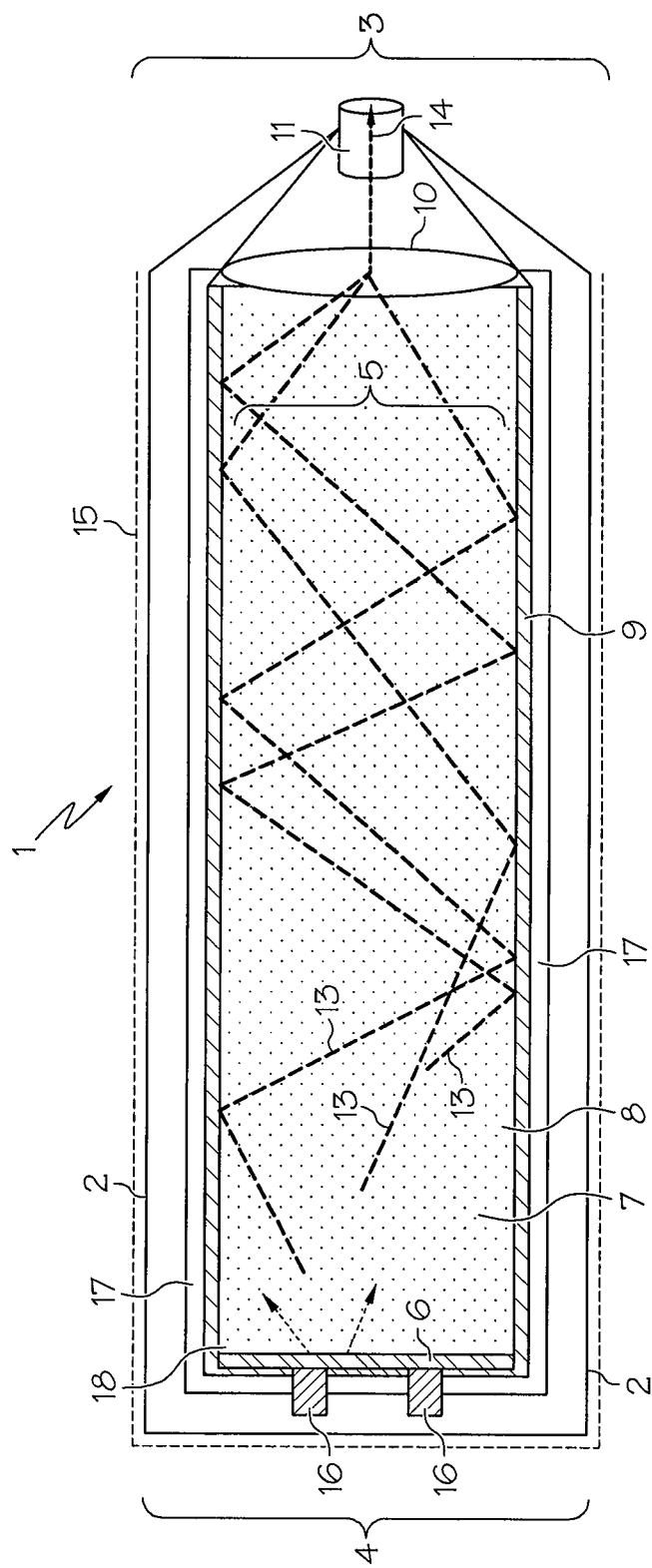
FIG. 2 represents another embodiment of a self-contained, random scattering laser device as herein disclosed and described showing the path of emitted photons and generation of laser beam.
Figure 3:
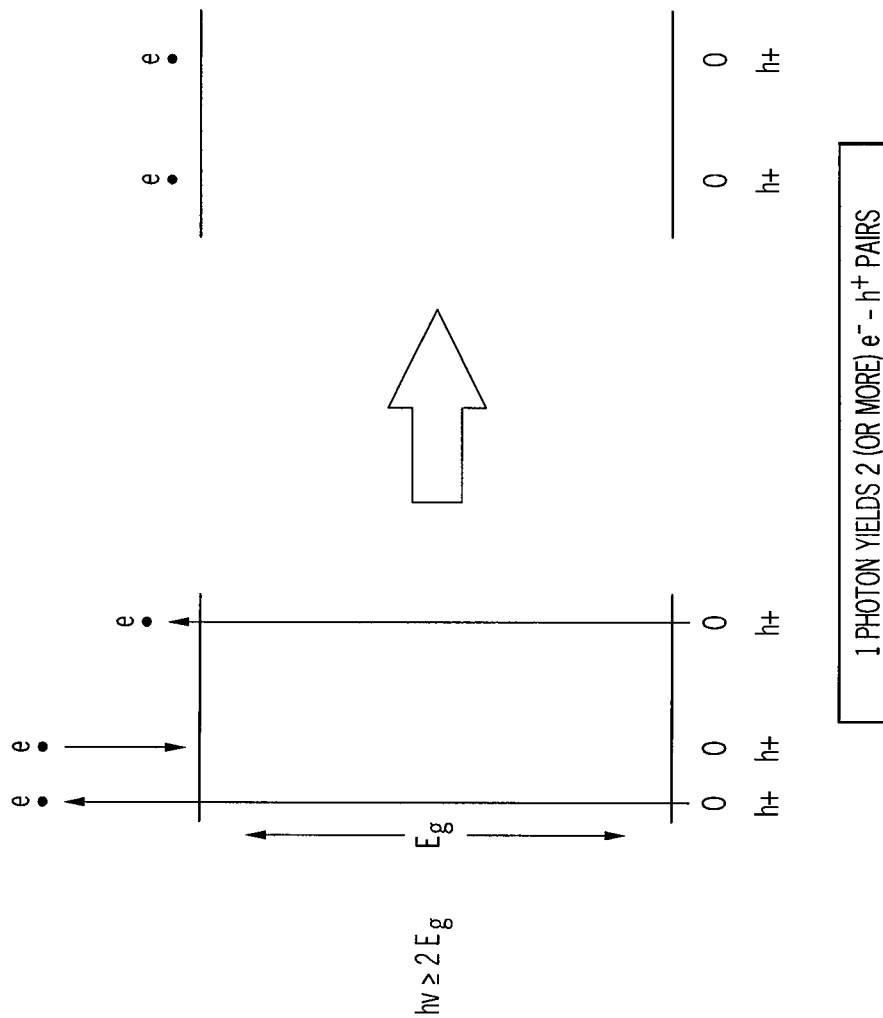
FIG. 3 is a diagram showing the multi-excition generation for a 2 eV quantum dot.

In one aspect, the disclosure provides a random scattering laser generating device as described above. Referring to FIG. 2, the device generally indicated at 1 comprises a housing 2 comprising a first end 3, a second end 4, and an inner chamber 5. Within the inner chamber 5, the device comprises a high-energy emitting source 6, at least one quantum dot 7 operating at a desired wavelength dispersed within a matrix 8 which is in radiation communication with the high-energy emitting source 6, and at least one reflector 9 positioned in optical communication with the at least one quantum dot 7. The waves/particles 12 emitted from the high-energy emitting source 6 is absorbed by the quantum dots 7 which then produce electron hole pairs that recombine to emit photons 13 in a fairly narrow region centered around the bandgap of the quantum dot 7. Hence, the wavelength of the generated laser light will depend on the bandgap of the quantum dots selected. This process also results in the emission of additional photons 13 for each radioactive particle 12 released from the high-energy emitting source 6 absorbed by the at least one quantum dot 7 through the process of multi-excition generation (MEG). As shown in FIG. 3, this process involves the generation of multiple electron-hole pairs from the absorption of a single photon, thus considerably increasing the light emitting efficiency of the device.

Referring again to FIG. 2, as these photons 13 are then redirected by total internal reflection or reflection by the reflector 9 through the quantum dot/matrix 7, 8 whereby the photons 13 are transitioned from a higher energy state to a lower energy state and become coherent through random scattering. Therefore, the randomness is a result of the spatial disorder in the quantum dot 7 size and positioning within the matrix 8, which leads to space-dependent charge carrier and inter-level polarization dynamics (i.e., light that strikes the nonmetallic surface of the quantum dot at any angle other than perpendicular will result in reflected beams that is polarized preferentially in the plane parallel to the surface). Light 13 that is locally created by the quantum dot 7 via stimulated emission may then travel to surrounding quantum dots 7 where a partially coherent amplification occurs. In contrast, current random lasers that utilize laser gain medium such as highly scattering powders, ceramics, films, or liquids with suspended light scattering nanocrystals, wherein the feedback is provided by light scattering. The transitioned photons 13 then pass through an aperture 10 and out of the device 1 as a laser 14. In certain embodiments, the device 1 comprises a focusing element 11 positioned in optical communication with the aperture 10 to allow for manipulation of the emitted laser 14.

As used herein, the term "housing" refers to any material suitable for containing radioisotope material (e.g., preventing the leakage of radiation from inside the housing). Preferably, the housing will comprise one or more materials that possess both radiation-shielding characteristics along with heat-transferring properties, thereby allowing the housing to serve as a radiation shield and a heat sink. Examples of such materials are known in the art. The housing may be made by forming composite particles into a wall-like body as a shield by hot-press (or cold-press) forming. The core of a composite particle may made of a material selected from the group comprising polyethylene, polystyrene, polypropylene, bakelite, graphite, beryllium, oxides of beryllium, boron, compounds of boron, aluminum, oxides of aluminum, iron, ferroalloys, lead, lead alloys, gadolinium, oxides of gadolinium, cadmium, cadmium alloys, indium, indium alloys, hafnium, hafnium alloys, depleted uranium, and the like. As shown in FIG. 2, the housing may further comprise a high-emittance coating 15 to aid in the dissipation of heat generated from the radioisotope. In such embodiments, the coating material of high thermal conductivity may include, but are not limited to, anodized aluminum, aluminum oxide, zinc oxide, magnesium oxide, composites thereof and combinations thereof. In preferred embodiments, the high emittance coating is anodized aluminum. The coating material does not necessarily need to cover the whole surface of the core particle. It is desirable, however, to cover the whole surface in order to increase the thermal conductivity among composite particles by ensuring a large contact area of composite particles. In another embodiment, the housing 2 may also be of any shape, for example, conical, cubic, cylindrical, and the like.

In another embodiment, and as shown in FIG. 2, the device 1 may further comprise one or more additional heat sinks 16 in thermal communication with the high-energy emitting source 6. As used herein, the term "heat sink" refers to any object that has the ability to absorb and dissipate heat from another object using thermal contact (either direct or radiant). To ensure optimal thermal contact, the surface of the heat sink generally needs to be flat and smooth. The heat sink 16 may be made from any material that is a good thermal conductor, such as, but not limited to, copper or aluminum alloy. It is also within the scope of the present disclosure that a thermally conductive grease be added to the contact portion of the heat sink to ensure optimal thermal contact. Such greases typically contain ceramic materials such as beryllium oxide and aluminum nitride, but may alternatively contain finely divided metal particles, such as colloidal silver. Optimal thermal contact between the heat sink 16 and the device 1 may also be achieved by mechanical means, such as by a clamping mechanism, screws, or thermal adhesives to firmly hold the heat sink 16 onto the device 1 without pressure that would crush or damage the device 1.

In certain applications, particularly terrestrial applications where the device 1 may come in contact with living organisms, it may be desirable to have additional insulation to help absorb any excess heat and/or radiation that may be emitted from the device 1. As such, and as shown in FIG. 2, it is also within the scope of the present disclosure that the device 1 may further comprise an insulation layer 17 positioned between the radioisotope and the housing 2. Any insulating material may be used that is suitable for blocking heat dissipation and/or radiation. Examples of suitable insulating materials include, but are not limited to, boron nitride or aluminum oxide. In preferred embodiments, the insulation layer is boron nitride.

As will be appreciated by the ordinary skilled artisan, the high-energy emitting source 6 of the present disclosure refers to any atom with an unstable nucleus that undergoes radioactive decay and emits high energy waves/particles, including subatomic particle(s). As used herein, the term "subatomic particles" refers to the elemental or composite particle which is smaller than an atom, such as alpha particles, beta particles and gamma particles, quarks, protons, neutrons, electrons and the like. Preferably, the high-energy emitting source of the present disclosure will have a half-life long enough to produce energy at a relatively continuous rate for a reasonable amount of time while also being long enough such that it decays sufficiently quickly enough to generate a usable amount of heat. In certain embodiments, the high-energy emitting source will emit alpha rays. In other embodiments, the high-energy emitting source will emit beta rays. In other embodiments where the light modulation communication device will be used for space applications, the high-energy emitting source will preferably produce a large amount of energy per mass and volume (e.g., density). Examples of high-energy emitting sources may include, but are not limited to, thallium-204, plutonium-238, curium-244, strontium-90, polonium-210, promethium-147, caesium-137, cerium-144, ruthenium-106, cobal-60, curium-242, and americium-241. In certain embodiments, the radioactive heat source is thallium-204, plutonium-238, curium-244 or strontium-90. Preferably, the high-energy emitting source is thallium-204.

The high-energy emitting source 6 is positioned within the inner chamber 5 of the housing 2. In one embodiment, and as shown in FIGS. 1 and 2, the high-energy emitting source 6 may be in the form of a "coating", whereby a layer of radioisotope is positioned along an interior surface of the inner chamber 5 such that the high-energy emitting source 6 remains in radioactive communication with the at least one quantum dot 7. The amount of radioisotope coating (e.g., thickness) needed will be dependent on the characteristics of the particular radioisotope and can be readily determined by one skilled in the art. For example, thallium-204 has a half-life of 3.78 years and emits a beta particle with an average energy of 245 KeV and a specific activity of 17,000 gigabecquerals per second per gram.

Figure 4:
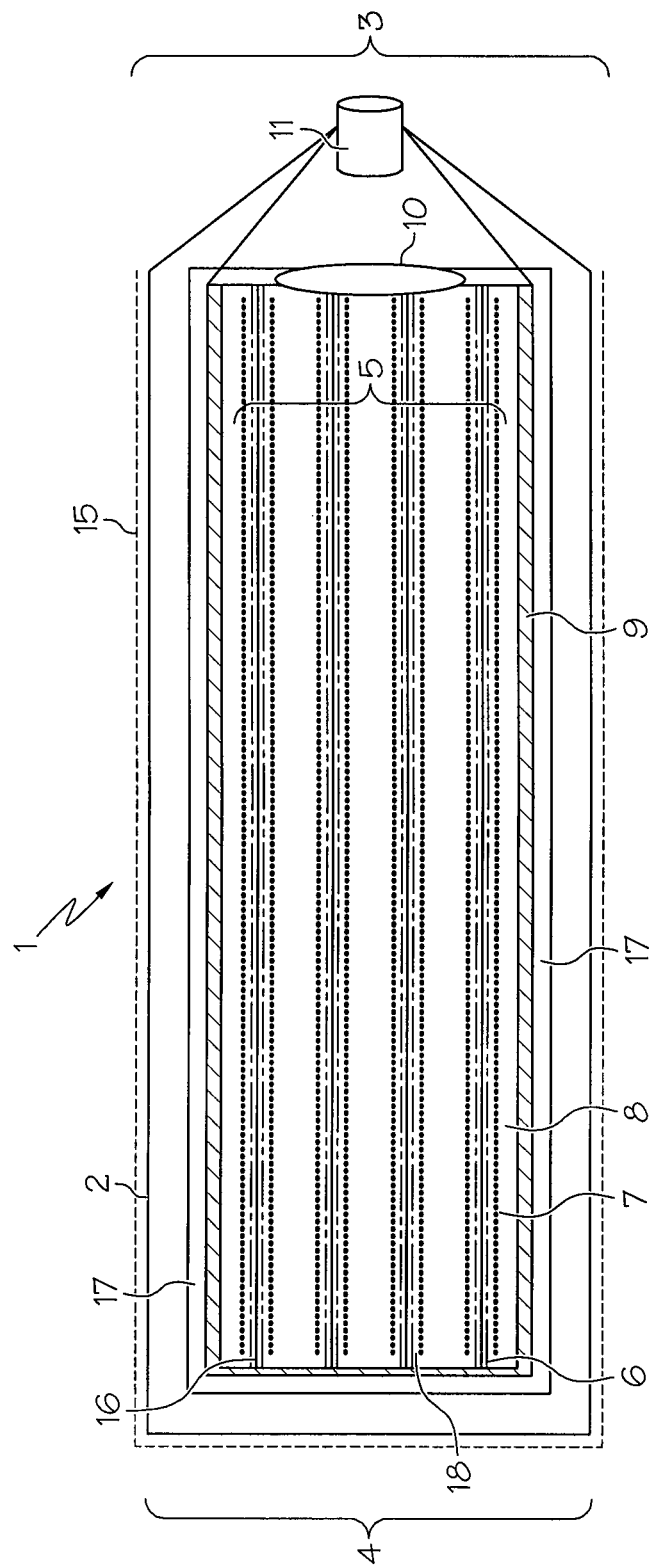
FIG. 4 represents another embodiment of a self-contained, random scattering laser device as herein disclosed and described.

In another embodiment, and as shown in FIG. 4, the high-energy emitting source 6 is in the form of a block or rod located within the inner chamber 5 of the housing 2. In certain embodiments, the high-energy emitting source 6 is positioned around a heat sink 16. The placement of the high-energy emitting source 6 is not critical so long as the source is in radioactive communication with the at least one quantum dot 7 dispersed in the matrix 8.

As will be appreciated by the ordinary skilled artisan, the term "quantum dot" ("QD") in the present disclosure is used to denote a semiconductor nanocrystal. In one aspect as herein disclosed and described, the QD 7 comprises only one type of material, however, it is also within the scope of this disclosure that the QD comprise a core and a cap comprised of different materials (i.e. fluorescence of the QD can be increased and enhanced by using a core/cap structure). Hence, in those embodiments where fluorescence of the QD is desired, a core/cap structure may be used. Regardless of whether a single material or a core/cap structure is used, the entire QD preferably has a diameter ranging from 0.5 nm to 50 nm, more preferably from 1 nm to 40 nm, more preferably from 1 nm to 30 nm, and more preferably from 1 nm to 20 nm.

In one embodiment, the QD comprises a "core" that is a nanoparticle-sized semiconductor. Any core of the II-VI semiconductors (e.g., ZnS, ZnSe, ZnTe, CdS, CdSe, CdTe, HgS, HgSe, HgTe, alloys thereof and mixtures thereof), III-V semiconductors (e.g., GaAs, GaP, GaSb, InGaAs, InAs, InP, InSb, AlAs, AlP, AlSb, alloys thereof and mixtures thereof), IV (e.g., Ge, Si) or IV-VI semiconductors (e.g., PbS, PbSe, PbTe) can be used in the context of the present disclosure. In a certain embodiments, the core is a semiconductor that comprises a narrow band gap, typically less than 3 eV, preferably less than 2 eV, more preferably less than 1 eV.

In another embodiment, the wavelength emitted by the QDs is selected of the physical properties of the QDs, such as the size of the nanocrystal. QDs are known to emit light from about 300 nm to about 1700 nm. Preferably, the wavelength emitted by the QDs of the present disclosure upon excitation by alpha or beta particles is in the visible to infra red (IR) wavelength regime. For example, CdSe QDs can be produced that emit colors visible to the human eye, so that in combination with a source of higher energy than the highest energy of the desired color, these QDs can be tailored to produce visible light of a spectral distribution. QDs can also be produced to emit light in the ultraviolet and infra red spectral ranges. Examples of ultraviolet- and infrared-emitting QDs include, but are not limited to, CdS, ZnS, and ZnSe, and InAs, CdTe and MgTe, respectively. Hence, the wavelength of the laser light depends on the bandgap of the quantum dots selected. Preferable wavelengths emitted by the QDs upon excitation with alpha or beta particles of the present disclosure include the range of 1 nm to $10^{11}$ nm, preferably 10 nm to $10^7$ nm, and more preferably 100 nm to $10^6$ nm.

As used herein, the term "visible light" refer to those wavelengths found on the electromagnetic spectrum between ultraviolet light and infra red light that are visible with the human eye. Typical wavelengths for visible light range between 325 nm and 800 nm in length, preferably between 350 nm and 775 nm in length, more preferably between 375 nm and 760 nm, and more preferably between 380 nm and 750 nm.

As used herein, the term "infra red light" refers to the wavelength of light which is longer than visible light but shorter than terahertz radiation and microwaves. Infra red light has a wavelength of between 750 nm and 1 mm. Of the International Commission on Illumination, infra red light encompasses three "subdivisions" based on wavelength. These include: (1) Infra Red-A (IR-A) that has a wavelength range of about 700 nm to 1400 nm; (2) Infra Red-B (IR-B) that has a wavelength range of about 1400 nm to 3000 nm; and (3) Infra Red-C (IR-C) that has a wavelength range of about 3000 nm to 1 mm. Those skilled in the art will also recognize that Infra Red light may also be subclassified of the following scheme: (1) Near-infra red (NIR) that has a wavelength of about 0.75 to 1.4 $\mu$m; Short-wavelength infra red (SWIR) that has a wavelength of about 1.4 $\mu$m to 3 $\mu$m; (3) Mid-wavelength infra red (MWIR) that has a wavelength of about 3 $\mu$m to 8 $\mu$m; (4) Long-wavelength infra red (LWIR) that has a wavelength of about 8 $\mu$m to 15 $\mu$m; and (5) Far infra red (FIR) that has a wavelength of about 15 $\mu$m to 1,000 $\mu$m. All of these are within the scope of the present disclosure.

As used herein, the term "ultraviolet light" refers to those wavelengths found on the electromagnetic spectrum between visible light and soft x-rays. Ultraviolet light encompasses five "subdivisions" based on wavelength. These include: (1) NUV (also known as Near) that has a wavelength range of 200 nm-400 nm; (2) UVA (also known as long wave or black light) that have a wavelength range of 320 to 400 nm; (3) UVB (also known as medium wave) that have a wavelength range of 280 nm to 320 nm; and (4) UVC (also known as short wave or germicidal) that have a wavelength range of below 280 nm. Those wavelengths below 280 nm have also been further subdivided to include FUV/VUV (also known as far or vacuum UV) that has a wavelength range of 10 nm to 200 nm and EUV/XUV (also known as Extreme or Deep UV) that has a wavelength range of 1 nm to 31 nm). Preferable ultraviolet light wavelengths used in the present disclosure include the range of 1 nm to 300 nm, preferably 10 nm to 280 nm, more preferably 50 nm to 275 nm, and more preferably 100 nm to 260 nm.

In another embodiment, the QDs may be "tuned" by varying the composition and the size of the QD and/or adding one or more caps around the core in the form of concentric shells to widen the band gap width of the QD. As the QD approaches the excitation Bohr radius of the semiconductor of the QD, the band gap will get wider. Therefore, the smaller the QD, the wider the band gap. For example, the band gap of gallium arsenide in bulk is 1.52 electron volts (eV), while a QD consisting of 933 atoms of gallium and arsenide has a band gap of 2.8 eV, and a dot half as big, with 465 atoms, has a band gap of 3.2 eV. This results in the QD's light emission wavelength going from the red portion of the visible spectrum to the violet/ultraviolet portion of the visible spectrum. Therefore, changing the band gap, and thus the color of light a QD absorbs or emits, requires only adding or subtracting atoms from the QD.

In another embodiment, it may also be desirable to tailor the size distribution of the QDs of a particular core composition to tailor the color of light which is produced by the device. The size distribution may be random, gradient, monomodal or multimodal and may exhibit one or more narrow peaks. For example, the QDs dispersed in the matrix may vary in diameter by less than a 10% rms, thus ensuring production of light in a monochromatic color. As used herein, the term "monochromatic" refers to the color generated by the QDs as comprising photons of a narrow wavelength range. In one embodiment, the wavelength range is between 10 and 100 nm, preferably between 10 and 80 nm, more preferably between 10 and 60 nm, and most preferably between 10 and 50 nm. In other embodiments, QDs of varying diameters may be used to ensure production of light in a polychromatic color. As used herein, the term "polychromatic" refers to color generated by the QDs as comprising photons of a wider wavelength range.

In another embodiment, where fluorescence by the QD is desired, the core semiconductor may further comprise a "cap" or "shell." The "cap" is a semiconductor that differs from the semiconductor of the core and binds to the core, thereby forming a surface layer or shell on the core. The cap must be such that, upon combination with a given semiconductor core, results in a luminescent quantum dot. In this regard, the cap helps stabilize and enhance the fluorescence emitted by the excited core (e.g., when the core is contacted with ultraviolet light). Preferably, the cap passivates the core by having a higher band gap than the core, so the excitation of the QD is confined to the core, thereby eliminating nonradiative pathways and preventing photochemical degradation. Typical examples of QD cores include, but are not limited to, ZnO, ZnS, ZnSe, ZnTe, CdO, CdS, CdSe, CdTe, MgS, MgSe, GaSa, GaN, GaP, GaSb, HgO, HgS, HgSe, HgTe, InAs, InN, InP, InSb, AlAs, AlN, AlP, AlSb, alloys thereof, and combinations thereof. Some examples of core:cap combination which are within the scope of the present disclosure include, but are not limited to, CdS/HgS/CdS, InAs/GaAs, GaAs/AlGaAs, and CdSe/ZnS. In general, the cap is 1-10 monolayers thick, more preferably 1-5 monolayers, and most preferably 1-3 monolayers. A fraction of a monolayer is also encompassed under the present disclosure.

QDs may be synthesized in various ways. Some common methods include (1) the spontaneous generation in quantum well structures due to monolayer fluctuations in the well's thickness; (2) the capability of self-assembled QDs to nucleate spontaneously under certain conditions during molecule beam epitaxy (MBE) and metallorganic vapor phase epitaxy (MOVPE), when the material is grown in a substrate to which it is not lattice matched; (3) the ability of individual QDs to be created from two-dimensional electron or hole gases present in remotely doped quantum wells or semiconductor heterostructures; and (4) chemical methods, such as synthesizing ZnTe QDs in high-temperature organic solution (see, e.g., Zhang, J. et al. Materials Research Society Symposium Proceedings, Vol. 942, 2006). These and other processes for the synthesis of QDs are well known in the art as disclosed, for example, by U.S. Pat. Nos. 5,906,670, 5,888,885, 5,229,320, 5,482,890, and Hines, M. A. J. Phys. Chem., 100, 468-471 (1996), Dabbousi, B. O. J. Phys. Chem. B, 101, 9463-9475 (1997), Peng, X., J. Am. Chem. Soc., 119, 7019-7029 (1997), which are incorporated herein by way of reference.

As will be appreciated by the skilled artisan, the quantum dots 7 are dispersed within a matrix 8. The matrix 8 refers to any material in which QDs 7 can be dispersed and that is at least partially transparent or translucent, i.e., allows light to pass through, or conductive of light from the high-energy emitting source 6. In certain embodiments, the matrix 8 contains a dispersion of QDs 7, wherein the size and distribution of the QDs has been chosen to produce light of a certain wavelength. Some examples of matrix material include, but are not limited to, Sol-Gel, polyacrylate, polystyrene, polyimide, polyacrylamide, polyethylene, polyvinyl, poly-diacetylene, polyphenylene-vinylene, polypeptide, polysaccharide, polysulfone, polypyrrole, polyimidazole, polythiophene, polyether, epoxies, silica glass, silica gel, siloxane, polyphosphate, hydrogel, agarose, cellulose and the like. In preferred embodiments, the matrix is Sol Gel or polyacrylamide.

In other embodiments, for example, the at least one quantum dot is selected from the group consisting of gallium arsenide (GaAs), indium gallium arsenide (InGaAs), and gallium nitride (GaN). In another embodiment, the at least one quantum dot may comprise $TiO_2$ nanoparticles coated with $Al_2O_3$ to prevent flocculation. It is also within the scope of this disclosure that the at least one quantum dot may also be suspended in a solutions, such as diethylene glycol solution comprising rhodamine 640 perchlorate dye.

Figure 5:
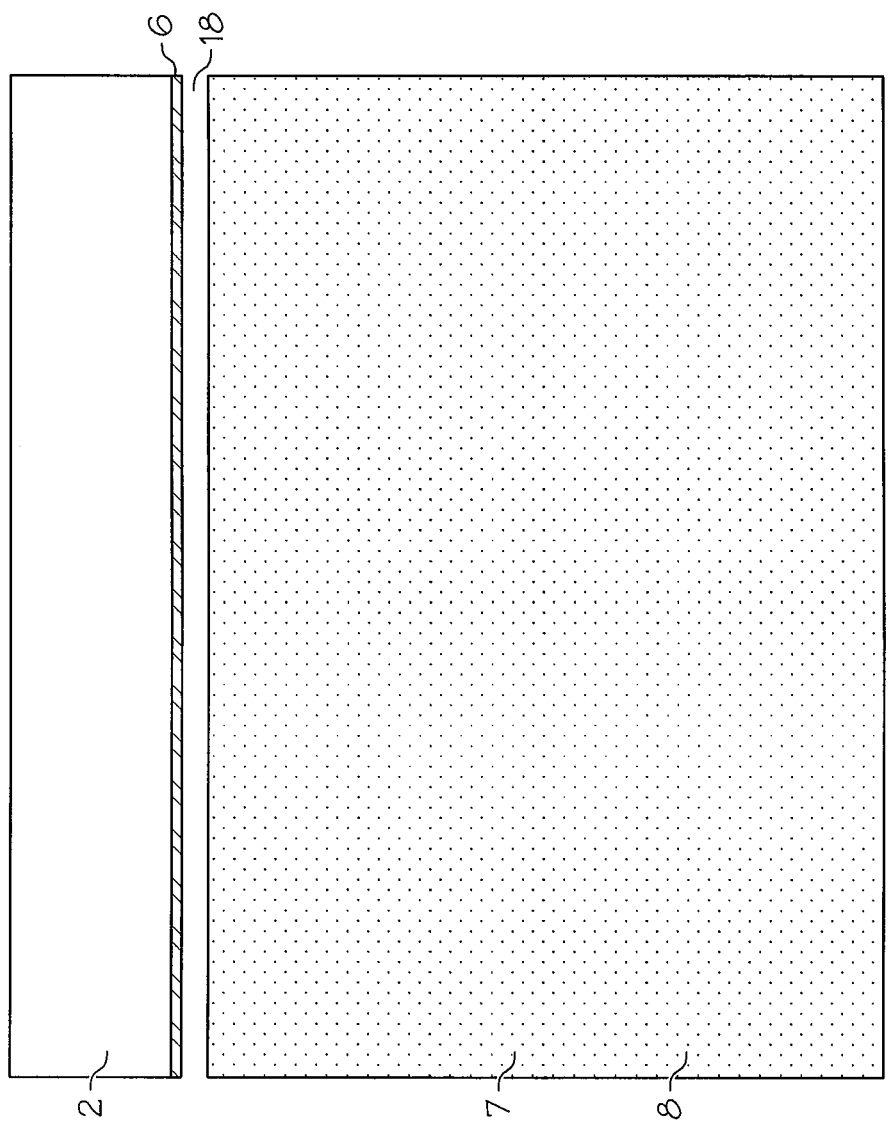
FIG. 5 is a close up depiction of a laser generating device of the present disclosure highlighting the gap between the quantum dot matrix and radioisotope coating to prevent loss of photons from evanescent wave coupling.

In another embodiment, and as shown in FIGS. 2, 4 and 5, a gap 18 is present between the matrix 8 and the high-energy emitting source 6, as well as the first and second ends 3, 4 of the device 1 to prevent evanescent wave coupling losses from the matrix 8. Preferably, the gap 18 is of sufficient size to prevent evanescent wave coupling losses. For example, the gap may be between 0.0001 and 0.1 inches, preferably between 0.001 and 0.07 inches, more preferably between 0.001 and 0.06 inches, more preferably between 0.001 and 0.065 inches, and more preferably between 0.001 and 0.0625 inches.

As will be appreciated by those skilled in the art, the term "reflector" refers to any material that is able to change the direction of a wave front at an interface between two different media so that the wave front is able to return into the medium from which it originated. In one embodiment, the reflector 9 is a material that exhibits perfect, or near perfect, specular reflection of visible and near-visible light range (e.g., ultraviolet radiation, x-ray, infrared radiation and the like). Examples of suitable reflector include, but are not limited to, mirrors, polished metals such as aluminum and stainless steel, SilverLux® and the like. In one embodiment, and as shown in FIGS. 1, 2 and 4, at least one reflector 9 is positioned along at least inner portion of the inner chamber 5. Preferably, at least two reflectors 9 are positioned along at least two sides of the inner chamber 5. More preferably, at least three reflectors 9 are positioned along at least three of the sides of the inner chamber 5.

In certain embodiments, the quantum dots 7 dispersed within the matrix 8 serve as a first lasing medium. The terms "lasing medium," "active laser medium," and "gain medium" are used interchangeably herein and refer to any medium that can serve as a source of optical gain within a laser. The gain results from the stimulated emission of electronic or molecular transitions to a lower energy state from a higher energy state, thereby amplifying the power of light.

Figure 6:
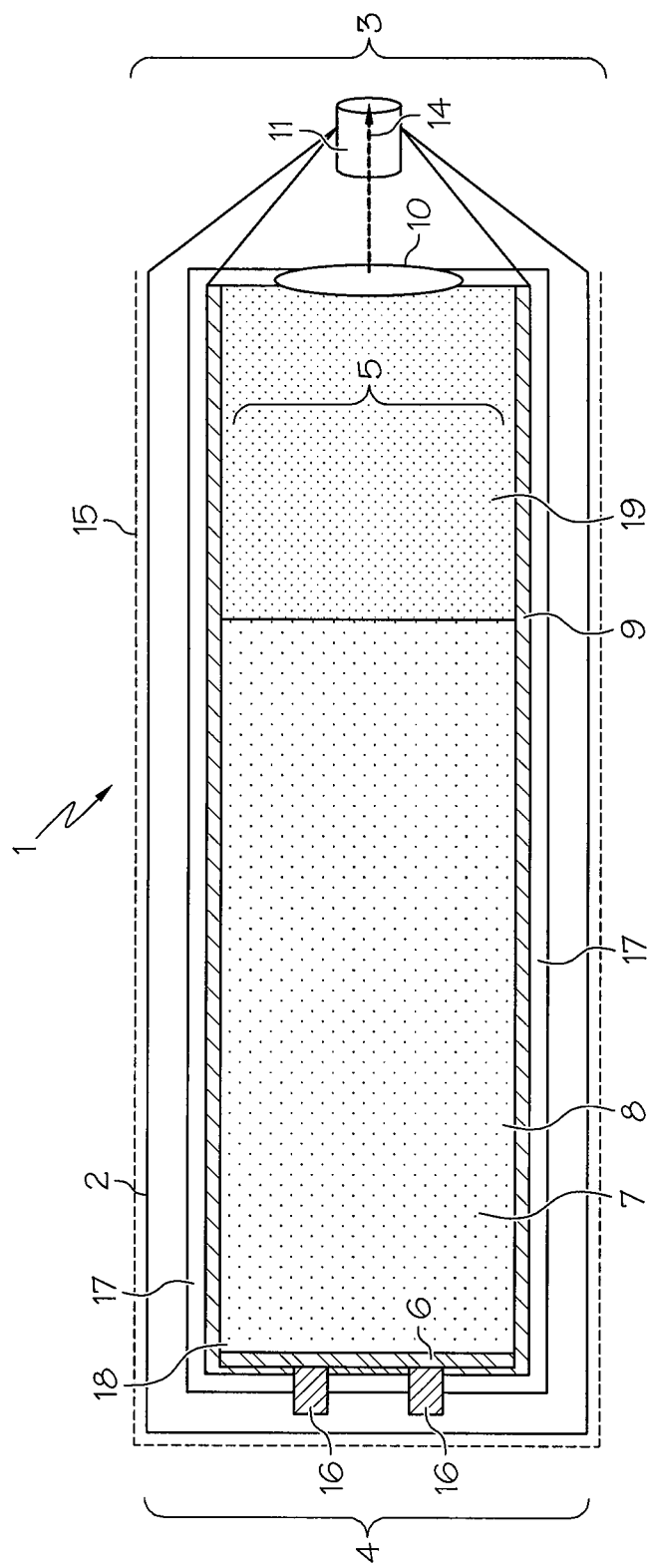
FIG. 6 represents another embodiment of a self-contained, random scattering laser device as herein disclosed and described.

In certain embodiments, and shown in FIG. 6, the device 1 may further comprise a plurality of lasing medium, e.g., a second lasing medium 19 in optical communication with the at least one quantum dot 7. The second lasing medium of the plurality of lasing medium used in the present disclosure will have one or more of the following properties:

(1) a laser transition in the desired wavelength region, preferably with the maximum gain occurring in this region;

(2) a high transparency of the host medium in this wavelength region;

(3) a pump wavelength for which a good pump source is available;

(4) a suitable upper-state lifetime that is long enough for Q-switching applications but short enough if fast modulation of the power is required;

(5) a high quantum efficiency, obtained via a low prevalence for quenching effects, excited-state absorption and the like, but also possibly strong enough beneficial effects such as certain multi-photon transitions or energy transfers;

(6) four-level behavior;

(7) robustness and a long lifetime, chemical stability;

(8) for solid-state lasing media, a medium that is available with a good optical quality in the required size, can be cut and polished with good quality, allows for high doping with laser-active ions without clustering, is chemically stable (e.g., not hydroscopic), and has a good thermal conductivity and low thermo-optic coefficients (for weak thermal lensing in high-powered operation) and high resistance to mechanical stress; optical isotropy and/or birefringence (i.e. reducing thermal depolarization) and polarization-dependent gain;

(9) for high gain, low threshold pump power: a high product of emission cross section and upper-state lifetime ($\sigma$-$\tau$ product);

(10) for low beam quality, a high pump absorption;

(11) a large gain bandwidth for wavelength tuning;

(12) high enough laser cross-sections for passive mode locking with Q-switching instabilities; and

(13) a high optical damage threshold and not too high saturation fluence of the gain for high energy pulse amplification.

There may be situations where there are partially conflicting requirements. For example, a very low quantum defect is not compatible with four-level behavior. In such cases, the desired properties can be readily determined and applied by one skilled in the art.

There are many suitable examples of lasing mediums known in the art, all of which are within the scope of the present disclosure (see, e.g., Wu, X. et al., *Physical Review* (2006), A74, 053812; Hecht, J. *The Laser Guidebook: Second Edition*. McGraw-Hill, 1992 (Chapter 22). In certain embodiments, at least one of the lasing medium is selected from the group consisting of crystals, glasses, and gasses. In one embodiment, the at least one lasing medium is a crystal. In other embodiments, the crystal is doped with a rare-earth ion or transition metal ion. In certain embodiments, the crystal is selected from the group consisting of yttrium aluminum garnet (YAG), yttrium orthovanadate ($YVO_4$).

In another embodiment, the at least one lasing medium is a glass. In certain embodiments, the glass is silicate or phosphate. In other embodiments, the glass is further doped with laser-active ions.

In another embodiment, the at least one lasing medium is a gas selected from the group consisting of helium and neon (HeNe), nitrogen, argon, carbon monoxide (CO), carbon dioxide ($CO_2$), and metal vapors.

In another embodiment, and as shown in FIGS. 1, 2 and 4, the device 1 may further comprise a focusing element 11 positioned in optical communication with the aperture 10. As used herein, the term "focusing element" refers to any object that enables particles or waves to converge. This narrowing may mean to cause the directions of motion to become more aligned in a specific direction (e.g., collimated or parallel) or to cause the spatial cross section of the beam to become smaller, or to cause the light to converge to a single point. The focusing element may include a curved (e.g. concave or convex) mirror, a partially transparent mirror, or lens. Preferably, the focusing element comprises a lens.

Figure 7A:
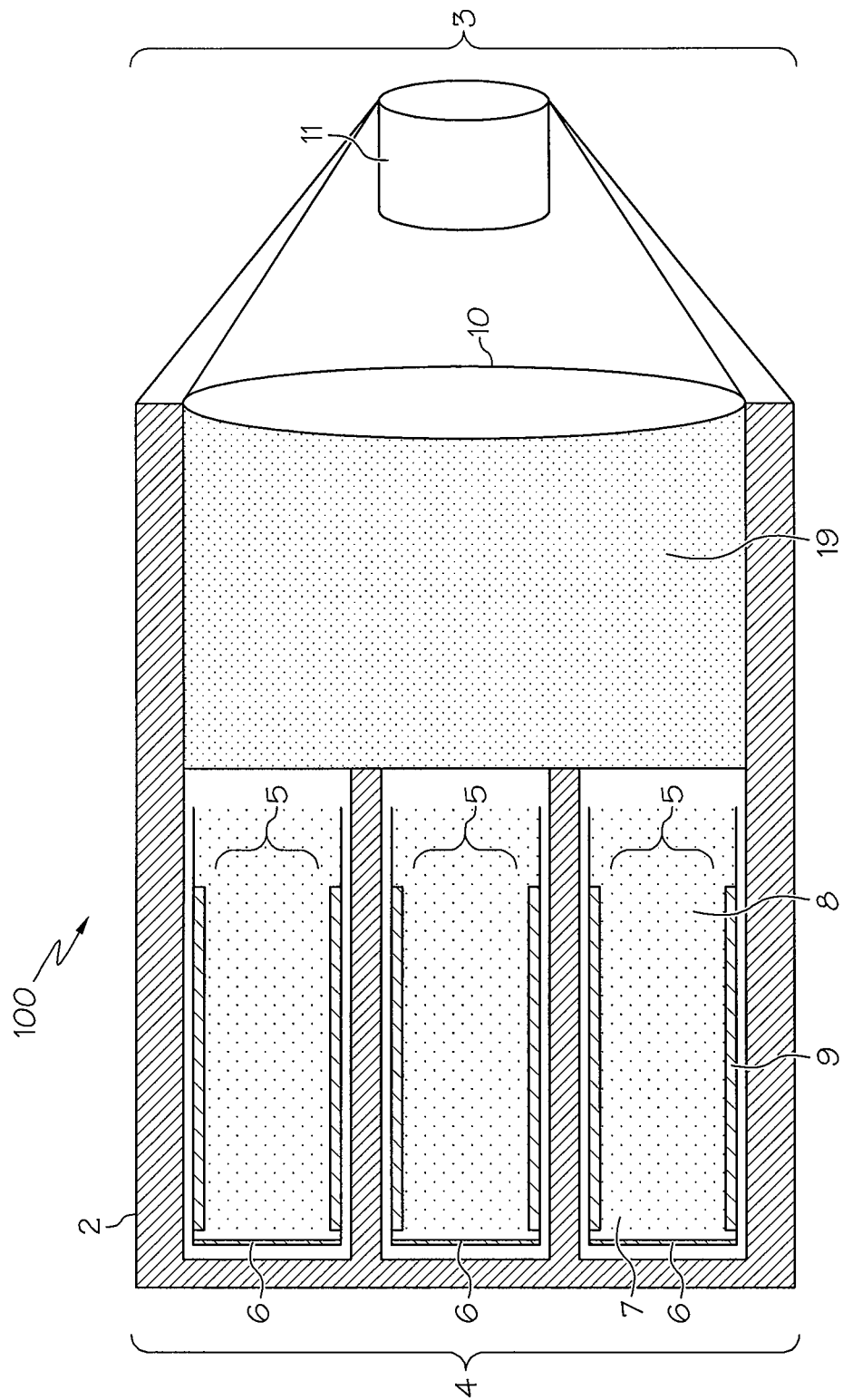
FIG. 7A represents another embodiment of a self-contained, random scattering laser device as herein disclosed and described.

In another aspect of the present disclosure, and as depicted in FIG. 7A, a concentrator stack 100 is provided that provides for an increase in the amount of light produced to produce an amplified laser. In these embodiments, the device 100 comprises a housing 2, a first end 3, a second end 4 and a plurality of inner chambers 5. With each inner chamber 5 is a plurality of quantum dots 7 that are dispersed in a matrix 8 and positioned within the plurality of inner chambers 5. Further, a plurality of reflector 9 are positioned within the plurality of inner chambers 5 and in optical communication with the plurality of quantum dots 7. A plurality of high-energy emitting sources 6 are positioned within the plurality of inner chambers 5 and in radioactive communication with the plurality of quantum dots 7. An aperture 10 is positioned proximal to the opening at end 3 of the device 100. Optionally, a plurality of lasing material, e.g. a second lasing medium 19 may be present between the plurality of inner chambers 5 and the aperture 10. A focusing element 11 may also be positioned proximal to the opening at end 3 of the device and in optical communication with the aperture 10.

Figure 7B:
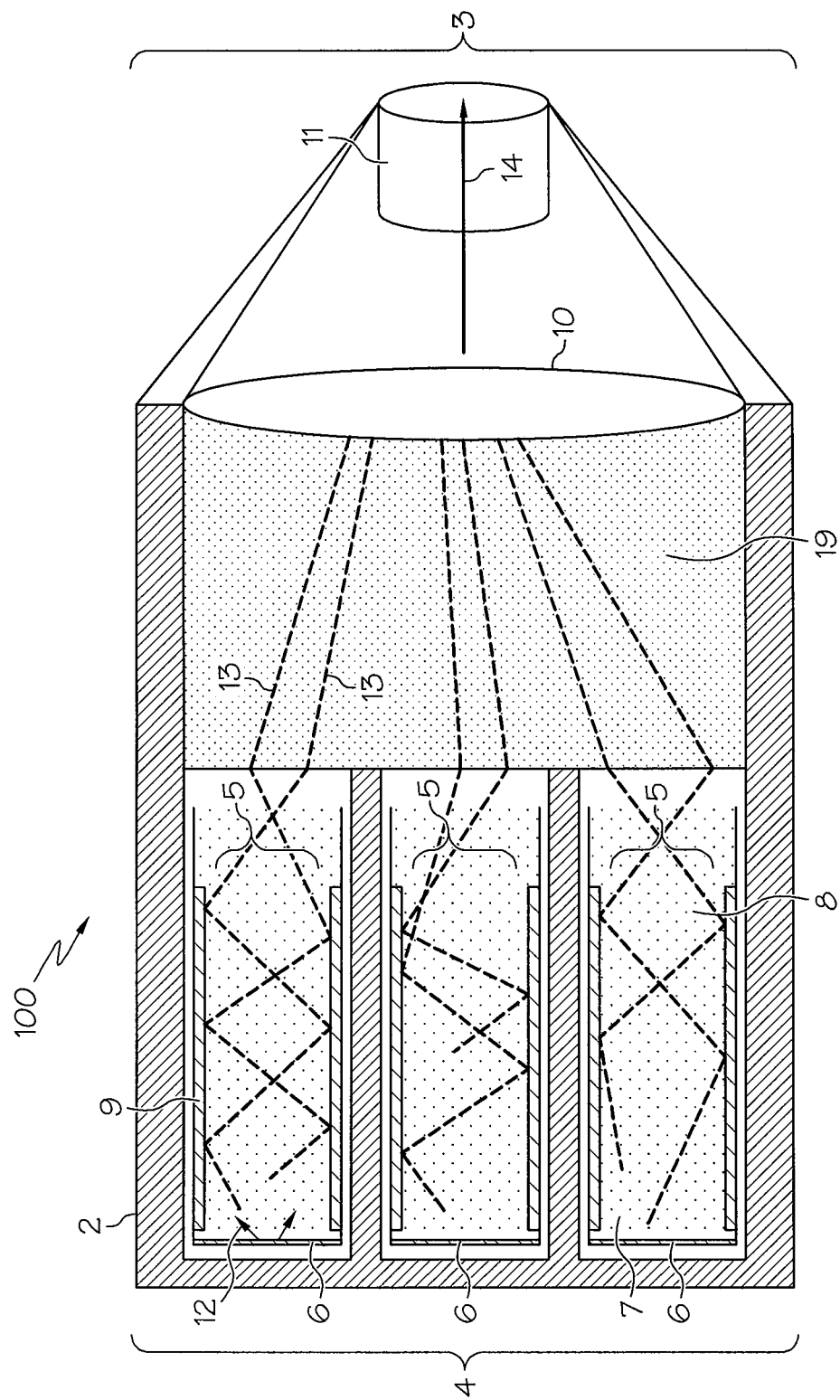
FIG. 7B represents the generation of a monochromatic laser using a device of the present disclosure.

As shown in FIG. 7B, the waves/particles 12 emitted from the high-energy emitting source 6 and absorbed by the quantum dots 7 result not only in a multitude of photons 13 to be emitted from each quantum dot 7, but additional photon emission due to the multi-excitation generation process (see FIG. 3). The photons 13 are then reflected down the inner chamber 5 via the reflector 9 where they are passed through a second lasing medium 19 thereby becoming coherent through random scattering. The coherent light is then transmitted through an aperture 10 positioned proximal to the opening at end 3 of the housing 2 and in optical communication with the quantum dots 7 found in the plurality of inner chambers 5. In other embodiments, the device 100 further comprises a focusing element 11 positioned proximal to the opening at end 3 of the housing 2 which is in optical communication with the aperture 10, thereby allowing for manipulation of the laser 14 after it has been transmitted from the device 100.

In one embodiment, and shown in FIG. 7B, a monochromatic laser is generated. In such embodiments, each inner chamber 5 comprises quantum dots 7 of the same type (e.g. the same diameter) dispersed in a matrix 8. The light 13 generated by the quantum dots 7 upon activation by the waves/particles 12 emitted by the high-energy emitting source 6 will be amplified and reflected by the reflector 9, passed through the aperture 10, and the focusing element 11 to produce a laser comprising monochromatic light 14.

Figure 7C:
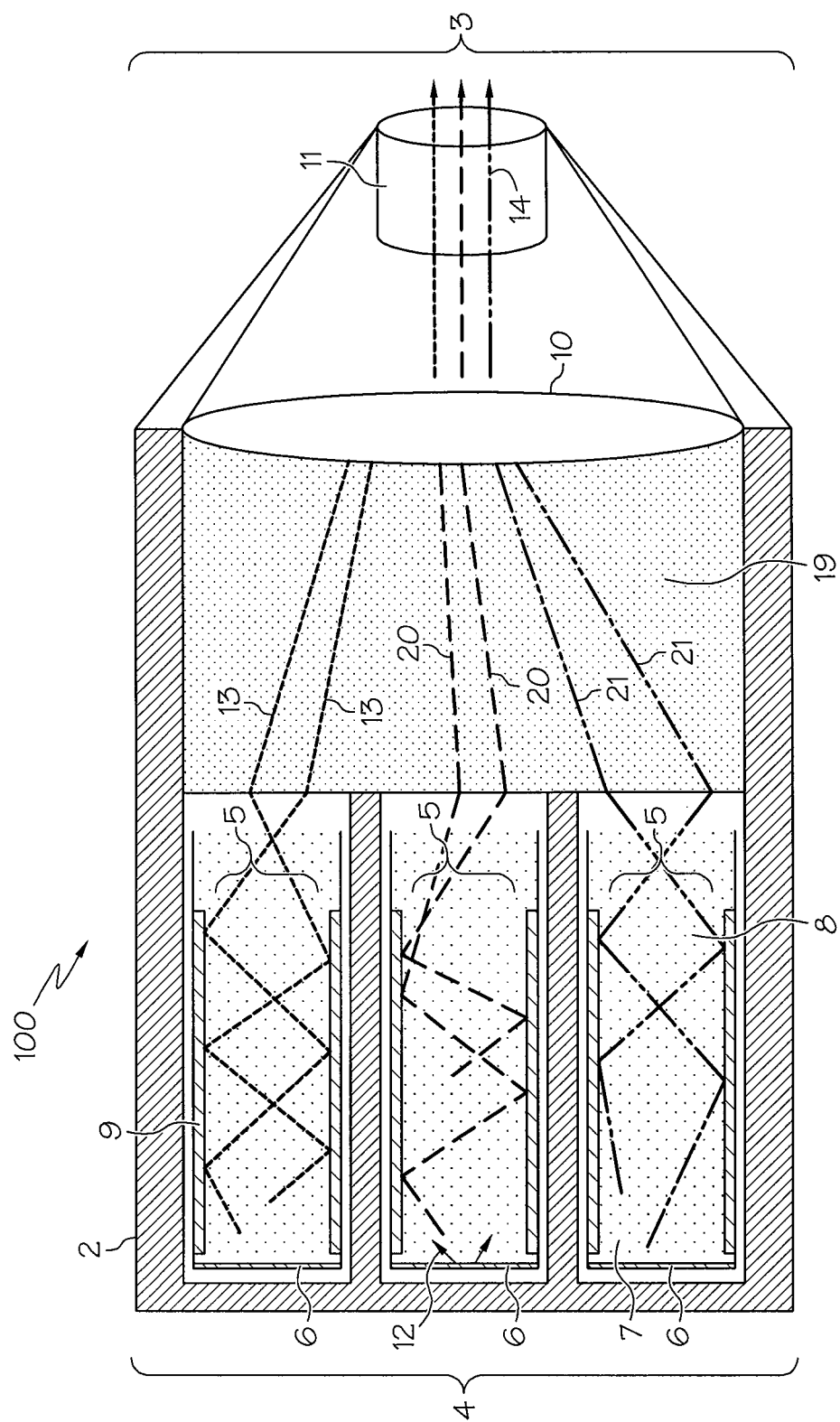
FIG. 7C represents the generation of a polychromatic laser using a device of the present disclosure.

In another embodiment, more than one color of light may be produced. When generating more than one color of light, it is usually desirable that the QDs be isolated from each other within the matrix. For example, when two QDs of different sizes are in close contact, the larger QD, which has a lower characteristic emission energy, will tend to absorb a large fraction of the emissions of the smaller QD, and the overall energy efficiency of the device will be reduced, while the color will shift towards the red. To avoid such problems, and as shown in FIG. 7C, it is also within the scope of the present disclosure to comprise a concentrator stack 100 that comprises a plurality of inner chambers 5, where each inner chamber 5 comprises quantum dots 7 of different types (e.g. different diameters) dispersed in a matrix 8. The light of different colors 13, 20, 21 is then generated by the quantum dots 7 upon activation by the waves/particles 12 emitted by the high-energy emitting source 6 and amplified and reflected by the reflector 9, passed through the aperture 10, and the focusing element 11 to produce a beam of polychromatic laser 14.

In yet another aspect, the present disclosure provides a method of producing a self-contained, scattering laser comprising providing a housing having a first end, a second end, and an inner chamber; providing at least one quantum dot dispersed in a matrix and positioned inside the inner chamber; providing at least one reflector positioned within the inner chamber and in optical communication with the at least one quantum dot; providing a high-energy emitting source positioned within the inner chamber and in radioactive communication with the at least one quantum dot; optionally providing a second lasing medium positioned within the inner chamber and in optical communication with the at least one quantum dot; providing an aperture positioned adjacent to the lasing medium and proximal to the opening, and optionally providing a focusing element in optical communication with the aperture.

Another aspect of the present disclosure provides a method of generating a random scattering laser of the devices of the present disclosure, where the method comprises generating a light source by interacting a subatomic particle emitted from a high-energy emitting source with at least one quantum dot dispersed in a matrix. This interaction results in light emission due to the stimulation of the quantum dot. Randomness of the light is thereby created by the spatial disorder in the quantum dot size and positioning in the matrix, thereby leading to space-dependent charge carrier and inter-level polarization dynamics. Next, the light is amplified by reflecting the light with a reflector and through partially coherent amplification resulting from light emitted from the stimulated quantum dot. The photons are then aligned in a uniform pattern and transmitted through an aperture. The emitted photons are emitted in the form of a laser.

These and other aspects as herein disclosed and described may become more readily apparent in connection with the following representative examples which are presented for purposes of illustration and not by way of limitation.

It is understood that the foregoing detailed description and the following examples are illustrative only and are not to be taken as limitations upon the scope of the disclosure. Various changes and modifications to the disclosed embodiments, which will be apparent to those skilled in the art, may be made without departing from the spirit and scope of the present disclosure. Further, all patents, patent applications and publications cited herein are incorporated herein by reference.

We claim:

1. A self-contained, random scattering laser generating device comprising:
    a housing comprising an aperture and an inner chamber; at least
    one quantum dot positioned inside the inner chamber;
    a high-energy emitting source positioned within the inner chamber and in radioactive communication with the at least one quantum dot; and
    at least one lasing medium wherein the at least one quantum dot is physically separated from the high-energy emitting source by a gap, the gap sized to prevent evanescent wave coupling losses.

2. The device of claim 1, further comprising at least one reflector positioned within the inner chamber and in optical communication with the at least one quantum dot.

3. The device of claim 1, further comprising a focusing element positioned proximal to the aperture.

4. The device of claim 3, wherein the focusing element is selected from a partially transparent mirror, a curved mirror, or a lens.

5. The device of claim 1, wherein the quantum dot comprises one of:
    (i) a core selected from the group consisting of CdS, CdSe, CdTe, ZnS, ZnSe, ZnTe, GaAs, GaP, GaAs, GaSb, HgS, HgSe, HgTe, InAs, InP, InSb, AlAs, AlP, AlSb, PbS, PbSe, PbTe alloys thereof, and combinations thereof; or
    (ii) a cap, in combination with the core, selected from the group consisting of ZnO, ZnS, ZnSe, ZnTe, CdO, CdS, CdSe, CdTe, MgS, MgSe, GaAs, GaN, GaP, GaSb, HgO, HgS, HgSe, HgTe, InAs, InN, InP, InSb, AlAs, AlN, AlP, AlSb, alloys thereof, and combinations thereof.

6. The device of claim 1, wherein the at least one quantum dot is configured in a transparent or translucent matrix and physically separated from the at least one lasing medium.

7. The device of claim 6, wherein the matrix is selected from the group consisting of Sol Gel, polyacrylate, polystyrene, polyimide, polyacrylamide, polyethylene, polyvinyl, poly-diacetylene, polyphenylene-vinylene, polypeptide, polysaccharide, polysulfone, polypyrrole, polyimidazole, polythiophene, polyether, epoxies, silica glass, silica gel, siloxane, polyphosphate, hydrogel, agarose, and cellulose.

8. The device of claim 1, wherein the high-energy emitting source emits at least one of x-rays, alpha particles or beta particles.

9. The device of claim 1, wherein the high-energy emitting source is selected from the group of radioisotopes consisting of thallium-204, plutonium-238, curium-244, strontium-90, polonium-210, promethium-147, caesium-137, cerium-144, ruthenium-106, cobalt-60, curium-242, and americium-241.

10. The device of claim 1, wherein the at least one lasing medium is selected from the group consisting of crystals, crystals doped with a rare-earth ion or a transition metal ion, glasses and gases.

11. A self-contained, random scattering laser generating device comprising:
    a housing comprising an inner chamber;
    a transparent or translucent matrix of sol-gel or polyacrylate positioned inside the inner chamber;
    at least one quantum dot configured in the matrix, the quantum dot comprising at least one of CdS, CdSe, CdTe, ZnS, ZnSe, or ZnTe;
    a high-energy emitting source positioned within the inner chamber and in radioactive communication with the at least one quantum dot, the high-energy emitting source comprising thallium-204, wherein the at least one quantum dot is physically separated from the high-energy emitting source by a gap, the gap sized to prevent evanescent wave coupling losses;
    at least one lasing medium, physically separated from the transparent or translucent matrix, the lasing medium in optical communication with the at least one quantum dot;
    at least one reflector positioned within the inner chamber and in optical communication with the at least one lasing medium;
    an aperture providing an opening in the housing; and a lens positioned in optical communication with the aperture.

12. A method comprising:
providing at least one quantum dot;
contacting the at least one quantum dot with a high-energy emitting source, the high-energy emitting source physically separated from the at least one quantum dot by a gap, the gap size to prevent evanescent wave coupling losses, whereby randomly scattered light is produced; and
partially coherently amplifying the randomly scattered light emitted from the at least one quantum dot;
wherein a random scattering laser is generated.

13. The method of claim 12, wherein amplifying comprises internal reflection of the light within the housing.

14. The method of claim 12, further comprising transmitting the light through an aperture.

15. The method of claim 12, further comprising transmitting the light through a focusing element positioned in optical communication with the aperture, the focusing element selected from a partially transparent mirror, a curved mirror, or a lens.

16. The method of claim 12, wherein the quantum dot comprises one or more of:
(i) a core selected from the group consisting of CdS, CdSe, CdTe, ZnS, ZnS, ZnSe, ZnTe, GaAs, GaP, GaAs, GaSb, HgS, HgSe, HgTe, InAs, InP, InSb, AlAs, AlP, AlSb, PbS, PbSe, PbTe alloys thereof, and combinations thereof;
(ii) a cap selected from the group consisting of ZnO, ZnS, ZnSe, ZnTe, CdO, CdS, CdSe, CdTe, MgS, MgSe, GaAs, GaN, GaP, GaSb, HgO, HgS, HgSe, HgTe, InAs, InN, InP, InSb, AlAs, AlN, AlP, AlSb, alloys thereof, and combinations thereof; or
(iii) combinations of (i) and (ii).

17. The method of claim 12, wherein the at least one quantum dot is configured in a matrix selected from the materials consisting of Sol Gel, polyacrylate, polystyrene, polyimide, polyacrylamide, polyethylene, polyvinyl, poly-diacetylene, polyphenylene-vinylene, polypeptide, polysaccharide, polysulfone, polypyrrole, polyimidazole, polythiophene, polyether, epoxies, silica glass, silica gel, siloxane, polyphosphate, hydrogel, agarose, and cellulose.

18. The method of claim 12, wherein the high-energy emitting source is selected from at least one radioisotope consisting of thallium-204, plutonium-238, curium-244, strontium-90, polonium-210, promethium-147, caesium-137, cerium-144, ruthenium-106, cobal-60, curium-242, and americium-241.

19. The method of claim 12, wherein the at least one lasing medium is selected from the group consisting of crystals, crystals doped with a rare-earth ion or a transition metal ion, glasses and gases.

* * * * *